March 15, 1966 W. S. STEWART 3,240,263

MECHANICAL APPARATUS

Filed March 26, 1962

INVENTOR.
WALTER S. STEWART

BY Henry L. Hanson
ATTORNEY

United States Patent Office 3,240,263
Patented Mar. 15, 1966

3,240,263

MECHANICAL APPARATUS

Walter S. Stewart, Medford, Mass., assignor to Honeywell Inc., a corporation of Delaware Filed Mar. 26, 1962, Ser. No. 182,255
7 Claims. (Cl. 165—80)

This invention relates generally to heat transfer apparatus and particularly to an improved heat sink for transistors and related semiconductor devices.

The electrical properties of a transistor are known to be adversely and permanently affected when the semiconductor materials therein are subjected to excessive temperature conditions. Such conditions arise when the hysteretic losses generated within the transistor are not adequately transferred to the surrounding environment. In the absence of a low thermal resistance path, the temperature rise within the transistor may exceed the maximum temperature allowable at the semiconductor junctions, thereby damaging the crystalline bond and degrading the transistor performance. The heat losses and temperature rise may even be caused to increase regeneratively, without reaching equilibrium, resulting in the rapid burnout of the transistor.

The problems of heat transfer become appreciable in computer systems where a large number of transistors may be mounted on non-conductive densely-populated component board assemblies. Since an efficient heat conduction path is not available, the component boards are usually placed in the path of a circulating air stream whereby the heat may be convected away from the exposed transistor surfaces. When the transistors are operated in high-power or high-duty cycle modes, however, the normal air flow about the exposed surfaces may be insufficient to stabilize the temperature rise at a safe level. Consequently, it becomes necessary to provide additional means such as a heat transfer jacket mounted on the transistor, which jacket is arranged to have an enlarged and improved heat convection surface.

It has been found that presently known heat conductive jackets, or heat sinks, exhibit poor heat transfer efficiency and require a large mounting area. Others are expensive to fabricate and are limited to use with transistors whose case dimensions are held to within closely controlled tolerances.

It is therefore an object of the present invention to provide a new and improved heat sink for transistors and the like which exhibits optimum heat convection properties.

It is another object of the present invention to provide a heat dissipator for transistors and the like which is relatively inexpensive to manufacture and which occupies a limited mounting area.

It is a further object of the present invention to provide a heat transfer device which has an enlarged cooling surface adjacent the heat generating portion of the transistor.

It is yet another object of the present invention to provide a heat conductive jacket which will accommodate transistors and other similar devices of variable case diameter.

The foregoing objects and features of novelty which characterize the invention, are pointed out with particularity in the claims annexed to and forming a part of the present specification. For a better understanding of the invention, its advantages and specific objects obtained with its use, reference should be had to the accompanying drawings and descriptive matter in which there is illustrated and described a preferred embodiment of the invention.

Figure 1:
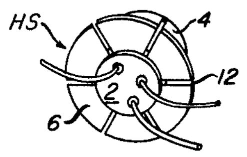
FIGURE 1 shows a perspective view of a transistor mounted within the heat transfer device of the present invention.

As shown in FIGURE 1 of the drawing, the numeral 2 identifies a transistor that is adapted to be contained within a heat sink HS formed in accordance with the principles of the present invention as set forth more fully hereinafter. The body or case of the transistor 2 is surrounded by a number of spring finger tabs 4 which slope inwardly to grasp the transistor adjacent its flanged base section. Each of the tabs 4 have end portions 6 which are enlarged and flared outwardly at the base of the transistor to form a segmented cooling surface. The heat losses generated within transistor 2, which are known to be greatest near the base portion thereof, are conducted through each of the enlarged end portions 6. The segmented ring formed by the end portions 6 provides a double-sided heat convection surface of sufficient area to stabilize the temperature rise within transistor 2 at a safe level.

Figure 2:
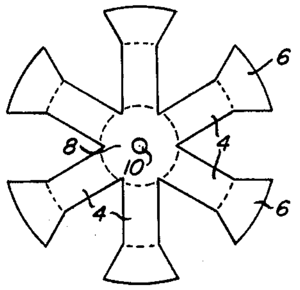
FIGURE 2 shows a plan view of a sheet metal cut-out from which the transistor heat sink may be formed.

FIGURE 2 illustrates a plan view of a sheet metal blank from which the heat sink HS may be formed. By means of a simple folding operation, the tabs 4 are formed inwardly towards the perpendicular, centrally located axis of the mounting surface 8. The enlarged end portions 6 are then flared outwardly from the aforementioned axis. The surface 8 includes a mounting hole 10 which may be used to affix the heat sink to a component board or to a thermally conductive chassis.

Figure 3:
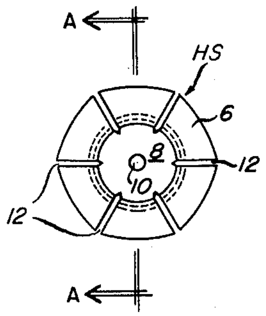
FIGURE 3 is a plan view of the heat sink of the present invention after it has been formed.

FIGURE 3 shows a top view of the heat transfer casing formed from the sheet metal cut-out illustrated in FIGURE 2. As shown in this view, a number of slots 12 will be formed between the enlarged end portions 6 and these slots will extend along the axial length of the casing to the end surface 8.

Figure 4:
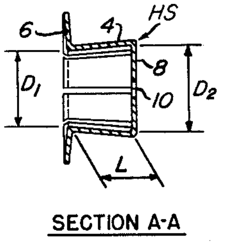
FIGURE 4 is a sectional view of the present invention taken along the lines A—A of FIGURE 3.

FIGURE 4 is a view taken along the section A—A of FIGURE 3. The heat sink HS has an expandable inner diameter $D_1$ adjacent the cooling surface which can vary in accordance with the case diameter of transistor 2. The diameter $D_1$ therefore will adapt itself to the range of case diameters encountered in a particular transistor type. The diameter $D_2$ at the mounting surface end 8 is made to be larger than the maximum expected case diameter of the particular transistor type and larger than the diameter $D_1$. The length L of the heat sink is sufficiently long to contain the transistor 2 and may be further extended to allow sufficient space for a mounting device inserted through the mounting hole 10.

Figure 5:
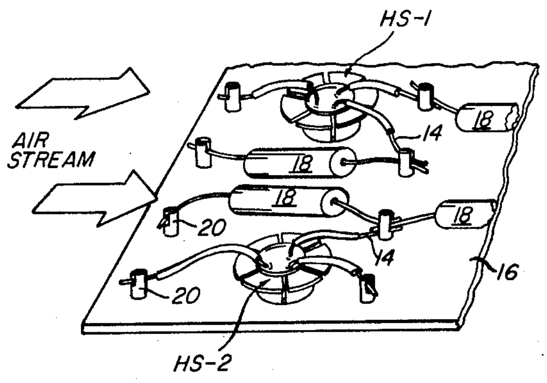
FIGURE 5 shows a portion of a component board assembly having transistor heat sinks of the present invention mounted thereon.

In FIGURE 5 there is shown a portion of a component board 16 having a number of electronic components 18 mounted thereon. The heat sinks HS–1 and HS–2 may, if desired, be permanently affixed to the board 16 by means of their respective mounting holes, such as the hole 10 shown in FIGURE 3, or may be held in place by means of the transistor leads 14 which are connected to terminal posts such as the posts 20. The cooling surface of the heat sink rests above the surface of the component board such that it may be placed in the path of a cooling air stream. The length of the heat sinks may be extended, if necessary, to clear the adjacent components 18. The components 18 may therefore be placed beneath the cooling surfaces of the heat sinks to conserve valuable component space.

While, in accordance with the provisions of the statutes, there has been illustrated and described the best form of the invention known, it will be apparent to those skilled in the art that changes may be made in the apparatus as described without departing from the spirit of the invention as set forth in the appended claims and that, in some cases, certain features of the invention may be used to advantage without a corresponding use of other features.

Having now described the invention, what is claimed as new and novel and for which it is desired to secure a Letters Patent is:

1. A heat sink adapted to contain a transistor having a flanged portion thereon comprising, a substantially circular sheet metal plate including a centrally located mounting hole, a plurality of spaced spring finger tabs integral with said plate and having first and second tab portions, said first tab portion sloping inwardly from the periphery of said plate towards a perpendicular, centrally located plate axis, said first tab portions terminating in a plane substantially parallel to said plate and axially spaced therefrom, said first tab portions forming an expandable clamp adapted to engage said transistor adjacent said flanged portion, and said second tab portions flaring outwardly with respect to said axis from said first tab portion terminations to form a substantially circular segmented cooling ring.

2. A heat transfer casing adapted to contain a transistor comprising, a sheet metal plate, a plurality of spaced spring finger tabs integral with said plate and having first and second tab portions, said first tab portions sloping inwardly from the periphery of said plate towards a perpendicular, centrally located plate axis, said first tab portions terminating in a plane substantially parallel to said plate and axially spaced therefrom, and said second tab portions flaring outwardly with respect to said axis from said first tab portion terminations to form an enlarged cooling surface.

3. A sheet metal cutout having a plurality of tabs when initially cut extending radially from a perpendicular central axis, said tabs joining together to form a mounting surface about said axis, said tabs being adapted to be folded inwardly towards said axis at a distance from said surface to form a heat transfer casing having axial slots between adjacent tabs as folded, said tabs further being enlarged at their ends opposite the position of the folds therein, and being adapted to be flared outwardly from said axis at the end of said casing opposite said mounting surface to form a segmented cooling surface.

4. A sheet metal cutout having a plurality of tabs when initially cut extending radially from a perpendicular central axis, said tabs joining together to form a mounting surface about said axis, said tabs being adapted to be folded inwardly towards said axis at a distance from said surface to form a heat transfer casing having axial slots between adjacent tabs as folded, and said tabs further being adapted to be folded outwardly from said axis at the end of said casing opposite said mounting surface to form a segmented cooling surface.

5. A sheet metal cutout having a plurality of tabs when initially cut extending radially from a substantially circular mounting surface, said tabs being adapted to be folded inwardly towards the perpendicular axis of said surface to form a heat transfer casing having axial slots between adjacent tabs as folded, said tabs further being enlarged at their ends opposite the position of the folds therein, and being adapted to be flared outwardly from said axis at the end of said casing opposite said mounting surface to form a segmented cooling surface.

6. A generally hat-shaped transistor heat sink, including crown and brim portions, said crown portion comprising an inverted hollow truncated right cone, said cone being closed at its wide end and open at the narrow end adjacent said brim portion, said closed end having a central aperture, the wall of said crown portion intermediate said ends having a plurality of regularly spaced slits running toward the imaginary apex of said cone, said brim portion extending outwardly from said narrow cone end and including a like pluarity of radial slits each constituting a continuation of the corresponding slit in said wall.

7. The apparatus of claim 6 wherein said brim portion is positioned at an angle with respect to the axis of said cone inclining toward said apex.

References Cited by the Examiner

UNITED STATES PATENTS 2,964,688 12/1960 McAdam ----------- 317—234

OTHER REFERENCES

"Erco New Product," International Electronic Research Corporation, page 131, published December 1, 1961.

FREDERICK L. MATTESON, Jr., *Primary Examiner.*

CHARLES SUKALO, *Examiner.*